United States Patent
Shan et al.

(10) Patent No.: US 6,906,421 B1
(45) Date of Patent: Jun. 14, 2005

(54) METHOD OF FORMING A LOW RESISTIVITY TI-CONTAINING INTERCONNECT AND SEMICONDUCTOR DEVICE COMPRISING THE SAME

(75) Inventors: Ende Shan, San Ramon, CA (US); Gorley Lau, Fremont, CA (US); Anthony Chung, San Ramon, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 594 days.

(21) Appl. No.: 09/006,958

(22) Filed: Jan. 14, 1998

(51) Int. Cl.$^7$ .................... H01L 23/48; H01L 23/52; H01L 29/40
(52) U.S. Cl. ...................... 257/763; 257/765
(58) Field of Search ................. 257/763, 765, 257/751, 764

(56) References Cited

U.S. PATENT DOCUMENTS

| | | | | |
|---|---|---|---|---|
| 4,471,376 A | * | 9/1984 | Morcom et al. | 257/765 |
| 4,896,204 A | * | 1/1990 | Hirata et al. | 257/765 |
| 4,910,169 A | * | 3/1990 | Hoshino | 437/198 |
| 4,985,750 A | * | 1/1991 | Hoshino | 357/71 |
| 5,225,372 A | * | 7/1993 | Savkar et al. | 257/765 |
| 5,360,995 A | * | 11/1994 | Graas | 257/765 |
| 5,567,987 A | * | 10/1996 | Lee | 257/751 |
| 5,843,837 A | * | 12/1998 | Baek et al. | 438/627 |
| 5,864,179 A | * | 1/1999 | Koyama | 257/767 |

FOREIGN PATENT DOCUMENTS

JP 59-171143 * 9/1984 ................. 257/765

* cited by examiner

Primary Examiner—Phat X. Cao
(74) Attorney, Agent, or Firm—Oblon, Spivak, McClelland, Maier & Neustadt, P.C.

(57) ABSTRACT

This invention relates to a method of forming a local interconnect and a semiconductor device comprising a local interconnect. The semiconductor device comprises:

a) a dielectric outside layer; and
b) a conductivity structure comprising:
   i) at least one barrier layer having a thickness of 10–200 Å on a surface of said oxide layer; and
   ii) a conductive layer comprising titanium, on said at least one barrier layer,
   said at least one barrier layer preventing diffusion of oxygen from said dielectric oxide layer into said conductive layer and having a corresponding oxide that is not soluble in said conductive layer.

12 Claims, 1 Drawing Sheet

METHOD OF FORMING A LOW RESISTIVITY TI-CONTAINING INTERCONNECT AND SEMICONDUCTOR DEVICE COMPRISING THE SAME

BACKGROUND OF THE INVENTION

1. Field of the Invention:

This invention relates to a method of forming a local interconnect and a semiconductor device comprising a local interconnect. The semiconductor device comprises:

a) a dielectric oxide layer; and b) a conductivity structure comprising:

i) at least one barrier layer having a thickness of 10–200 Å on a surface of said oxide layer; and ii) a conductive layer comprising titanium, on said at least one barrier layer, said at least one barrier layer preventing diffusion of oxygen from said dielectric oxide layer into said conductive layer and having a corresponding oxide that is not soluble in said conductive layer.

2. Discussion of the Background:

Integrated circuits comprise individual devices which are electronically connected through a series of metallization layers and vias. Vias are conductive connections formed through dielectric layers which provide an electrical connection to an active region of a semiconductor device. Vias to individual devices which are located within close proximity to each other, may be connected by a series of local interconnects. A local interconnect is a patterned metal layer, formed parallel to the plane of the semiconductor substrate, which locally connects vias. A series of vias and local interconnects may also connect an active region of a semiconductor device to a global interconnect layer, wherein the active region and global interconnect layer are separated by multiple dielectric layers.

The electrical conductivity of these local interconnects should be high, insofar as increased resistivity will reduce the speed and performance of the device.

Ti local interconnects are generally formed of a thin metal layer, typically of from 500 Å to 3 kÅ. After patterning a Ti line, a layer of dielectric film will be deposited followed by a planarization process. During later processes which subject a Ti line to elevated temperatures, Ti will absorb oxygen from an oxygen containing dielectric material. This results in a Ti film of increased resistivity due to dissolution of oxygen in the Ti. In order to compensate for increased film resistance, Ti thicknesses have been increased. Increased Ti thicknesses result in more expensive processing because of 1) difficulties in dielectric filling of high aspect ratio Ti line gaps; and 2) increased planarization time, such as CMP, needed to plannarize a thick dielectric layer to achieve global planarization.

Accordingly, an interconnect having good conductivity, and an efficient method for forming the same is desired.

SUMMARY OF THE INVENTION

Accordingly, one embodiment of tale present invention is directed to a semiconductor device comprising a local interconnect with high conductivity.

Another embodiment of the present invention is a method of forming a local interconnect.

These and other objects of the present invention are made possible by a method of forming a local interconnect, in which a barrier layer of a stable metal oxide is formed between a conductive layer comprising titanium and a dielectric oxide layer.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein.

DETAILED DESCRIPTION OF THE PREFERRED EMBODIMENTS

Figure 1:
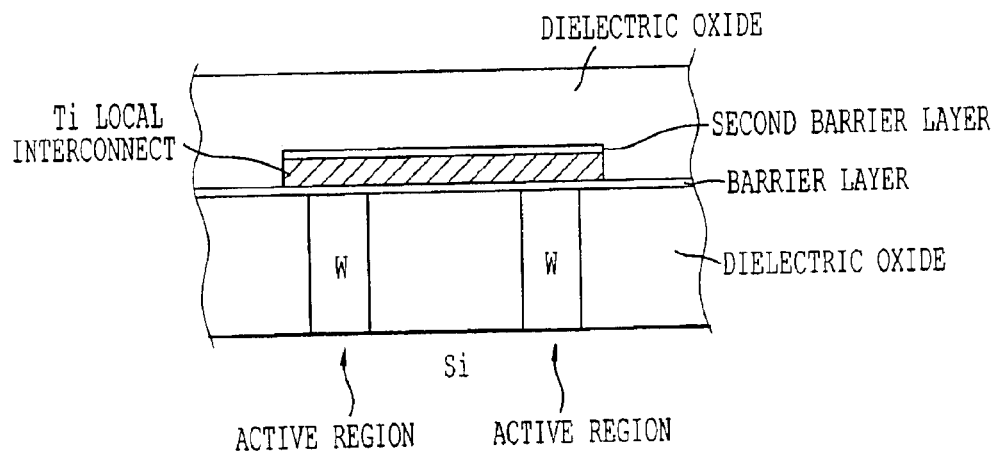
FIG. 1 illustrates a local interconnect formed between two vias connecting active regions of a semiconductor device.
Figure 2:
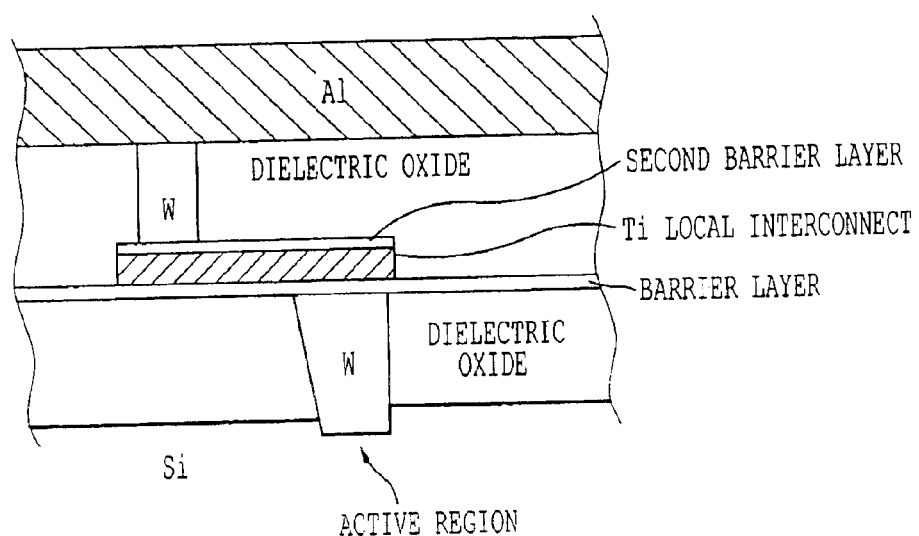
FIG. 2 illustrates a local interconnect formed between a via connecting an active region of a semiconductor device and a via connecting a global interconnect.

According to the present invention, a barrier layer is disposed at an interface between a conductive layer comprising titanium, and a dielectric oxide layer. Local interconnects may be used to conductively connect at least two vial, which themselves are connected to active regions of a semiconductor device or may conductively connect a via to a via which is connected to a global interconnect layer.

The dielectric oxide layer which forms an interface with the local interconnect is not particularly limited. Dielectric oxide layers which are capable of chemically reacting with an overlying titanium layer, under typical semiconductor processing conditions, are especially in need of a barrier layer. As suitable dielectric oxide, there are, included conventional oxides, oxynitrides, and other dielectrics, such as borophosphosilicate glass (BPSG), borosilicate glass (BSG), phosphosilicate glass, spin-on glass (SOG), silicon oxide, P-doped silicon oxide (P-glass), silicon dioxide, a conventional oxide/nitride/oxide structure, silicon oxynitride (e.g. of the general formula $[Si_aO_xN_y]$ such that $(x/2)+(3y/4)=a$), $V_2O_3$, tetraethylorthosilicate-based oxides, aluminum oxynitrides (e.g. of the general formula $[Al_bO_xN_y]$ such that $(2x/3)+y=b$), aluminosilicates and nitrides thereof (e.g. of the general formula $[Si_aAl_bO_xN_y]$ where $x=2a+3b/2$ and $y=4_a/3+b$), boron- and/or phosphorous-doped silicates, aluminates and aluminosilicates. Preferably the dielectric oxide layer is formed by CVD of TEOS or is a borophosphosilicate glass.

The thickness of the dielectric oxide layer is not particularly limited, however should be thick enough to electrically insulate the local interconnect from other electrically conductive materials of the semiconductor device, and to provide adequate speed of the semiconductor device. The thickness of the dielectric oxide layer is preferably within the range of about 0.3 to 3.0 µm, more preferably 0.5 to 2.0 µm, even more preferably 0.7 to 1.5 µm The dielectric oxide layer may comprise a single dielectric material, however, it may also comprise multiple layers of the same or different dielectric oxides.

Suitable dielectric oxide layers may be formed by conventional methods known to those of ordinary skill in the art. For example a semiconductor wafer is placed on a support base or susceptor in a CVD chamber of a vacuum deposition apparatus. The wafer and susceptor are heated to a temperature ranging from 390° C. to 600° C., preferably about 390° C. which is maintained throughout the deposition procedure. The chamber is maintained at a pressure of from about 40–760 Torr during the deposition.

A gaseous mixture is then introduced into the deposition chamber comprising one of more gaseous sources of boron, one or more gaseous sources of phosphorus, a gaseous source of oxygen and a silicon source such as tetraethylorthosilicate (TEOS). A carrier gas such as argon, nitrogen or helium may be used in the mixture of gases.

The gaseous sources of boron and phosphorus may comprise any gas respectively containing boron or phosphorus and other materials which will not interfere with the glass deposition and are capable of decomposing to form a gas capable of reacting with both the silicon compound and the oxygen source at the specified pressure and temperature ranges of the process. Preferably, such gaseous sources of boron and phosphorus will be organic boron containing and phosphorus-containing gases, which will decompose at the decomposition temperature with the remainder of the components of the gases volatilizing off and being removed by a vacuum pumping system, to maintain the vacuum in the chamber.

The dielectric oxide layer will typically have formed therein a via, electrically connecting an underlying active region of a semiconductor device. The formation of hole in a dielectric oxide layer and the filling of a via with a conducive material may be performed by conventional methods known to those of ordinary skill in the art.

After a via channel has been etched in the dielectric oxide, a liner layer material may be deposited into the via channel.

Non-limiting examples of suitable liner layer materials are titanium, zirconium hafnium, chromium, molybdenum, tungsten, copper, nickel, cobalt or noble metals such as ruthenium, rhodium, palladium, osmium, iridium, platinum gold and silver, alloys thereof such as titanium-tungsten and titanium nitride. The liner layer may promote adherence of the via conductive material to the side walls of the dielectric oxide as well as to the material of the conductive layer or region there below (e.g. a metal such as tungsten or Al or doped polysilicon).

The liner layer may be deposited by conventional methods known to those of ordinary skill in the art such as chemical or plasma vapor deposition, ionized metal plasma, sputtering, etch sputtering, etc.

A contact or plug may be formed by depositing a conductive material into the via channel.

Non-limiting examples of suitable conductive materials are titanium, zirconium, hafnium, chromium, molybdenum, tungsten, aluminum, polysilicon, copper, alloys thereof such as titanium-tungsten, tungsten silicide, titanium silicide etc. Preferably the conductive material comprises tungsten.

The conductive material may be deposited by conventional methods known to those of ordinary skill in the art, such as by atmospheric pressure Chemical Vapor Deposition (APCVD), low pressure Chemical Vapor Deposition (LPCVD), plasma-enhanced Chemical Vapor Deposition (EPCVD), conventional sputtering, collimated sputtering, or thermal or epitaxial growth. Preferably the conductive material is deposited by chemical vapor deposition. When tungsten is deposited, a reactive gas mixture comprising $WF_6$ and $SiH_4$ (which may further comprise $H_2$) may be used.

After deposition of the conductive material forming a via, further processing may include an etch back or planarization step, preferably planarizing using conventional Chemical Mechanical Polishing (CMP).

A barrier layer may now be formed overlying the dielectric oxide and electrically connecting the underlying via.

As a barrier layer, any metal, or metal oxide which is chemically stable relative to the formation of titanium oxides may be used. The barrier layer behaves as a barrier to oxidation of a conductive layer of Ti, especially oxidation caused by a reaction with a dielectric oxide layer. Suitable metals include, Al, Zr, Mg, Zn, Sn, In, and mixtures thereof, e.g. ITO. The barrier layer is typically converted, at least in part to the corresponding oxide during subsequent semiconductor processing techniques. The barrier layer according to the present invention may comprise at least one metal selected from the group consisting of Al, Zr, Mg, Zn, Sn, In, and mixtures thereof, an oxide thereof or a mixture thereof. The barrier layer may be directly deposited as a layer of metal oxide. Preferably the metal oxide is not soluble in the conductive layer comprising Ti. In a preferred embodiment, the barrier layer comprises Al, an oxide of Al or a mixture thereof.

The barrier layer need only be applied to obtain a thickness sufficient to prevent the substantial oxidation of a conductive layer comprising Ti. Substantial oxidation is an amount sufficient to adversely affect the electrical conductivity of the conductive layer comprising Ti. Oxidation typically results from interfacial migration of oxygen from the dielectric layer of the overlying Ti layer. For example a barrier layer of only 10 ∈ maybe used. Typically, a barrier layer of a thickness of from 50 to 500 ∈, preferably 75 to 200 ∈, more preferably about 100 ∈ is used. The thickness of the barrier layer is adjusted to a sufficient thickness to reliably cover the dielectric where it forms an Interface with the local interconnect, yet not significantly adversely affect the electrical conductivity of the local interconnect. Accordingly, a thinner barrier layer is preferred, such that it continues to function to prevent oxidation of a titanium layer.

The barrier layer may be deposited by conventional methods known to those of ordinary skill in the art. For example physical vapor deposition methods such as sputtering may be employed. Alternatively, Al CVD or E beam deposition techniques may be used.

The barrier layer may be deposited at any interface between Ti and a dielectric oxide layer. However, since the typical configuration of a local interconnect comprises a conductive layer located in between two dielectric oxide layers, in a preferred embodiment the present invention comprises a conductive layer comprising Ti located in between two barrier layers at the interface with two dielectric oxide layers. The composition of the two barrier layers may be the same or different.

After the barrier layer has been formed, the conductive layer comprising Ti may be formed, by conventional methods known to those of ordinary skill in the art. A conductive layer comprising titanium may be formed by PVD techniques at a pressure of 2 mTorr, a power of 2 Kw and a deposition rate of 30 ∈/sec. The conductive layer typically comprises Ti and may further comprise an alloy formed with the barrier layer as well as may comprise titanium oxides. In a preferred embodiment, when the barrier metal comprises Al, the conductive layer comprising Ti further comprises $TiAl_3$.

The thickness of the conductive layer is typically from 500–4,000 ∈, preferably 500 to 3,000 ∈, more preferably 1,000 to 2,000 ∈.

Typically, the distance in the horizontal plane of a local interconnect is about 1 $\mu$.

After the conductive layer comprising Ti has been formed, as optional second barrier layer may be deposited on the exposed surface thereof, by the technique previously described.

A local interconnect according to the present invention comprises a conductive layer comprising Ti, having deposited on at least one surface thereof a barrier layer. Alternatively, the local interconnect comprises a conductive layer comprising Ti having deposited on each surface, a barrier layer, such that the conductive layer comprising Ti is sandwiched between two barrier layers.

Patterning of the local interconnect layer, which comprises the barrier layer(s) and Ti layer may be conducted by conventional patterning techniques known to those of ordinary skill in the art.

The resistivity of the local interconnect is preferably less than 40 Ω-cm, more preferably less than 35 Ω-cm, and even more preferably less than 30 Ω-cm. Typically the resistivity of the local interconnect is not less than 20 Ω-cm.

Further elaboration of the semiconductor device may be conducted by conventional methods known to those of ordinary skill in the art. During these elaboration step, the conductive layer comprising Ti may be subject to elevated temperature (e.g heating) of at least about 40° C., typically greater than 100° C., even move typically greater than 200 to 300° C. temperatures which, in the absence of the barrier layer, would promote the formation of titanium oxides. Processing temperature will typically not exceed 800° C., and more typically will not exceed 600° C. The formation of titanium oxides would increase the resistivity of the interconnect. For example, a dielectric oxide layer may be deposited on the exposed surface of barrier layer by CVD. If necessary, planarization of the dielectric oxide lying above the conductive layer may be conducted by convention methods known to those of ordinary skill in the art, such as by CMP, in order to provide a planner surface.

Formation of a channel in the dielectric oxide layer, to the underlying local interconnect may be conducted by conventional methods known to those of ordinary skill in the art, such as by photolithography, etching and deposition as previously described. A further metalization layer may be formed and patterned forming a global interconnect.

Alternatively, direct filling of the channel with a conductive material and in the formation of a global interconnect may be by conventional methods known to those of ordinary skill in the art, and are not particularly limited. For a non-limiting example, aluminum may be deposited by PVD techniques at a power of 200–12,000 watts in an Ar or $N_2$ atmosphere. The temperature for Al PVD is about 200° C., from room temperature to 300° C. and a pressure of about 2–3 mtorr. The pressure of the Al PVD is not critical.

While not wishing to be bound by any particular theory, the inclusion of a barrier layer, is believed to prevent the formation of titanium oxides, which allows for the deposition of a thin local interconnect thickness, yet providing high conductivity. This allows for smaller devices in the vertical plane.

Obviously, numerous modifications and variations of the present invention are possible in light of the above teachings. It is therefore to be understood that within the scope of the appended claims, the invention may be practiced otherwise than as specifically described herein.

What is claimed as new and is desired to be secured by Letters Patent of the United States is:

1. A semiconductor device comprising:
   a) a dielectric oxide layer; and
   b) a conductivity structure comprising:
      i) at least one barrier layer having a thickness of 10–200 Å on a surface of said oxide layer; and
      ii) a conductive layer comprising titanium, on said at least one barrier layer, said at least one barrier layer preventing diffusion of oxygen from said dielectric oxide layer into said conductive layer and having a corresponding oxide that is not soluble in said conductive layer.

2. The semiconductor device of claim 1, wherein said barrier layer comprises at least one metal selected from the group consisting of Al, Zr, Mg Zn, Sn, In, ITO, a mixture thereof, and oxides thereof.

3. The semiconductor of claim 1, wherein said barrier layer comprises a material selected from the group consisting of Al, oxides thereof and mixtures thereof.

4. The semiconductor of claim 1, wherein said conductive layer further comprises an alloy of a metal of said barrier layer.

5. The semiconductor device of claim 1, wherein said conductive layer is of a thickness of 500 to 3,000 Å.

6. The semiconductor device, of claim 1, further comprising a second barrier layer on a surface of said conductive layer which is opposite said barrier layer.

7. The semiconductor device of claim 1, wherein said dielectric oxide layer is selected from the group consisting of borophosphosilicate glass (BPSG), borosilicate glass (BSG), phosphosilicate glass, spin-on glass (SOG), silicon oxide, P-doped silicon oxide (P-glass), silicon dioxide, a conventional oxide/nitride/oxide structure, silicon oxynitride, $V_2O_5$, tetraethylorthosilicate-based oxides, aluminum oxynitrides, aluminosilicates and nitrides thereof and mixtures thereof.

8. The semiconductor device of claim 1, wherein said barrier layer has a thickness of 10–100 Å.

9. The semiconductor device of claim 1, wherein said conductive layer has a thickness of 500–4,000 Å.

10. The semiconductor device of claim 1, wherein said conductive layer has a thickness of 1,000–2,000 Å.

11. The semiconductor device of claim 1, further comprising at least two vias conductively connected to said conductivity structure.

12. The semiconductor device of claim 1, further comprising a dielectric oxide layer overlying said conductivity structure; and
   a patterned metallization layer overlying said dielectric oxide layer.

* * * * *